United States Patent
Chien et al.

[11] Patent Number: 6,031,264
[45] Date of Patent: Feb. 29, 2000

[54] NITRIDE SPACER TECHNOLOGY FOR FLASH EPROM

[75] Inventors: Wen-Cheng Chien, Kao-hsiung County; Hui-Jen Chu, Kao-hsiung; Chen-Peng Fan, Hsin Chu Hsien, all of Taiwan

[73] Assignee: Taiwan Semiconductor Manufacturing Company, Hsin-Chu, Taiwan

[21] Appl. No.: 09/257,834

[22] Filed: Feb. 25, 1999

Related U.S. Application Data

[62] Division of application No. 08/940,001, Sep. 29, 1997, Pat. No. 5,879,993.

[51] Int. Cl.$^7$ ................................................. H01L 29/788
[52] U.S. Cl. .......................... 257/315; 257/316; 257/317; 257/320; 257/324
[58] Field of Search ...................... 257/315–317, 257/320, 324; 438/257, 266

[56] References Cited

U.S. PATENT DOCUMENTS

| | | | |
|---|---|---|---|
| 5,183,771 | 2/1993 | Mitsui et al. | 437/44 |
| 5,489,546 | 2/1996 | Ahmad et al. | 437/57 |
| 5,573,965 | 11/1996 | Chen et al. | 437/41 |
| 5,614,748 | 3/1997 | Nakaijima et al. | 257/316 |

FOREIGN PATENT DOCUMENTS

| | | | |
|---|---|---|---|
| 3-230576 | 10/1991 | Japan | 257/316 |

*Primary Examiner*—Tom Thomas
*Assistant Examiner*—Thien F Tran
*Attorney, Agent, or Firm*—George O. Saile; Stephen B. Ackerman; Graham S. Jones, II

[57] ABSTRACT

A flash EPROM device includes a floating gate electrode with a top surface and sidewalls is formed on a gate oxide layer covering a semiconductor substrate. A polyoxide cap layer is formed on the top surface of the floating gate electrode. A blanket tunnel oxide layer covers the cap layer, the sidewalls of the floating gate electrode, and the exposed surfaces of the gate oxide layer. A spacer structure is formed on the surface of the tunnel oxide layer adjacent to the sidewalls of the floating gate electrode and above the gate oxide layer. A dielectric, silicon nitride inner spacer, having an annular or an L-shaped cross section, is formed on the blanket tunnel oxide layer adjacent to the sidewalls of the floating gate electrode. In the case of the L-shaped cross section inner spacer, an outer dielectric, spacer is formed over the inner dielectric, spacer. A blanket interelectrode dielectric layer covers the blanket tunnel oxide layer, and the spacer structure. A control gate electrode is formed over the interelectrode dielectric layer on one side of the floating gate electrode.

17 Claims, 6 Drawing Sheets

NITRIDE SPACER TECHNOLOGY FOR FLASH EPROM

This is a division of U.S. patent application Ser. No. 08/940,001, filing date Sep. 29, 1997, now U.S. Pat. No. 5,879,993 Nitride Spacer Technology For Flash Eprom, assigned to the same assignee as the present invention.

BACKGROUND OF THE INVENTION

1. Field of the Invention

This invention relates to method and structures for the manufacture of semiconductor memory devices and more particularly to improved flash EPROM devices.

2. Description of Related Art

The processing of a silicon nitride ($Si_3N_4$) spacer (180 Å) etching is very critical for this type of manufacturing process for flash EPROM devices. Because the dimensions of the $Si_3N_4$ spacers are so small, it is difficult to control and maintain this process. The function of this thin silicon nitride spacer is to prevent write disturbance that is caused by reverse tunneling.

In general sidewall spacers formed of multiple layers are known in the industry.

U.S. Pat. No. 5,573,965 of Chen et al. for "Method of Fabricating Semiconductor Devices and Integrated Circuits Using Sidewall Spacer Technology" shows a method of forming a transistor using multi-layered structures of silicon dioxide alone or of silicon dioxide/silicon nitride. Chen shows the first spacer layer underlying subsequent spacers which is similar in structure as the invention.

U.S. Pat. No. 5,183,771 of Mitsui et al. for "Method of Manufacturing LDDFET Having Double Sidewall Spacers" shows a method of forming a transistor having double sidewall spacers both formed from silicon oxide layers over silicon substrate adjacent to the polysilicon gate electrode of a compound polysilicon/polycide gate electrode of a CMOS device, without a floating gate electrode.

U.S. Pat. No. 5,489,546 of Ahmad et al. "Method of Forming CMOS Devices Using Independent Thickness Spacers in a Split-Polysilicon DRAM Process" shows a transistor having a double sidewall spacer formed over a gate oxide layer with both layers composed of silicon nitride designed to vary the channel length in a CMOS device with a compound polysilicon/polycide gate electrode, without any floating gate electrode. Ahmad et al. also shows the first spacer layer underlying the subsequent spacer.

The above patents do not show the details/(exact compositions of the two spacer layers) of the invention.

SUMMARY OF THE INVENTION

In accordance with this invention a spacer structure is formed of a combination of a silicon nitride spacer with a silicon oxide spacer.

In accordance with this invention where an EPROM device includes an HTO silicon oxide structure formed over a polysilicon floating gate electrode, the HTO oxide is protected by a silicon nitride spacer formed by depositing a blanket silicon nitride layer over the HOT oxide layer formed by depositing a blanket silicon oxide over the blanket silicon nitride layer. Then the following step is to etch back the silicon oxide layer to form sidewall spacers adjacent to the silicon nitride layer. Then, a combination silicon nitride/silicon oxide sidewall spacer is formed adjacent to the floating gate electrode.

In accordance with another aspect of this invention, an EPROM semiconductor memory device is formed on a semiconductor substrate. There is a first gate oxide layer formed on the surface of the substrate; a floating gate electrode with a top surface and sidewalls formed on the surface of the gate oxide layer, the floating gate electrode being composed of doped polysilicon; a cap layer composed of an oxide of the floating gate electrode over the top surface of the floating gate electrode; a thin tunnel oxide layer covering the cap layer, the floating gate electrode and the gate oxide layer; a spacer structure adjacent to the sidewall of the floating gate electrode formed on the tunnel oxide layer above the gate oxide layer, the spacer structure comprising an inner dielectric, spacer layer and an outer dielectric, spacer layer formed over the device; the inner dielectric, spacer layer being formed as conforming L-shaped sidewalls adjacent to the sidewalls of the floating gate electrode; the outer dielectric, spacer layer being formed over the inner dielectric, spacer layer, the outer dielectric, spacer layer forming a spacer on the conforming L-shaped sidewalls of the inner dielectric, spacer layer; an interelectrode dielectric layer over the device cap, the spacer structure and the substrate; a control gate electrode over the interelectrode dielectric layer patterned with the floating gate electrode to form an gate electrode stack; the substrate including source/drain regions in the substrate cooperating with the gate electrode stack to form a memory cell.

Preferably, the cap layer has a thickness of about 100 Å, the inner dielectric, spacer layer comprises a silicon nitride layer having a thickness of about 180 Å, and the outer dielectric, spacer layer comprises a thick silicon oxide layer.

An advantage of the method of this invention is that it is easy to control and maintain the process.

Another advantage of the method of this invention is that the loss of the HTO (tunnel) oxide layer is reduced by the protection thereof provided by this method.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The process of FIGS. 1A–1G illustrate a first method for producing an EPROM device 10 with a HTO thermal oxide cap 18 and above the floating gate of the EPROM device 10. The problem with this method is that the silicon nitride spacers 24S, 24S' are thinned by the process used which makes it difficult to satisfy manufacturing specifications.

Figure 1A:
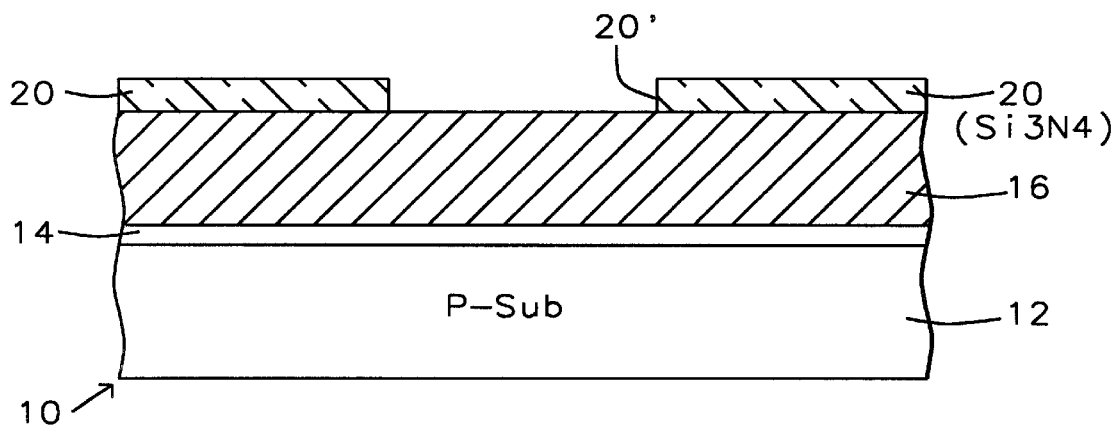
FIGS. 1A–1G illustrate the process steps of a method for producing an EPROM device with a HTO thermal oxide cap and above the floating gate of the EPROM device.

Referring to FIG. 1A, an EPROM device 10 is shown in a early stage of a possible manufacturing process which exemplifies the problem solved by this invention. A P-doped, silicon, semiconductor substrate 12 has a gate oxide layer 14 formed on the surface thereof. Above the gate oxide layer 14, a doped polysilicon conductor layer 16 has been deposited. Then a silicon nitride ($Si_3N_4$) mask 20 with opening 20' has been formed over the doped polysilicon conductor layer 16 by a process of Chemical Vapor Deposition (CVD) in a furnace in an atmosphere of $HN_3$ and silane $SiH_4$ to form the silicon nitride mask layer 20.

Figure 1B:
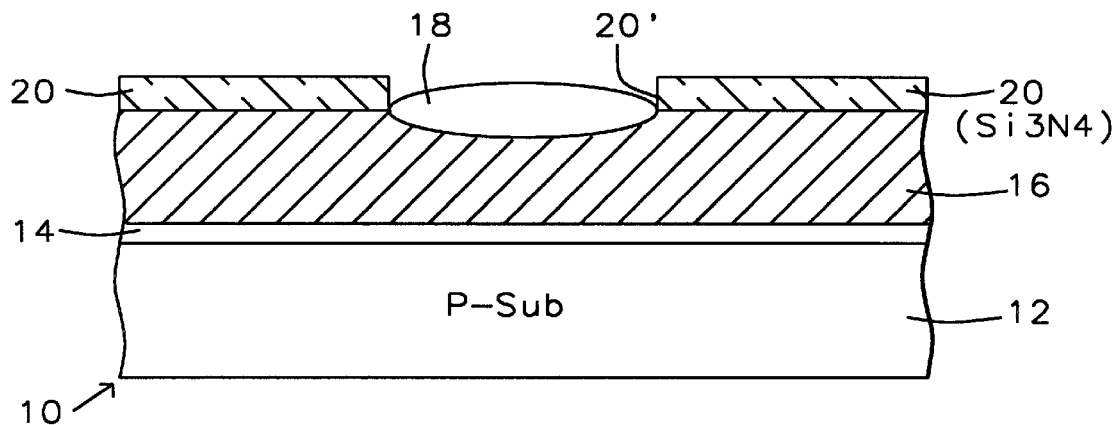

Referring to FIG. 1B the EPROM device 10 of FIG. 1A is shown after a thermal oxidation process has been employed to form a polyoxide (poly-silicon oxide) cap 18 with a by a HTO (High Temperature Oxide) process thickness of about 1,500 Å through the opening 20' in the $Si_3N_4$ mask 20 in a conventional HTO (High Temperature Oxidation) process by CVD (Chemical Vapor Deposition).

Figure 1C:
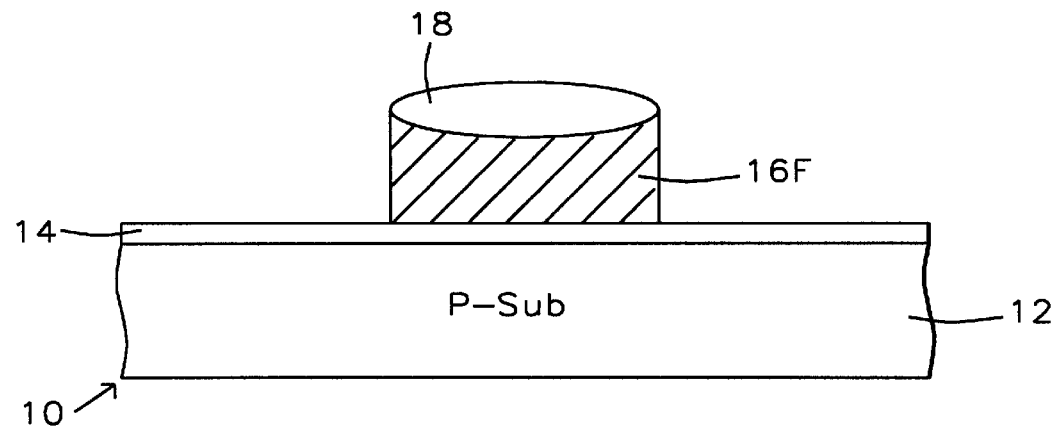

Referring to FIG. 1C the EPROM device 10 of FIG. 1B is shown after the silicon nitride ($Si_3N_4$) mask 20 has been stripped away. The newly exposed portion of the doped polysilicon conductor layer 16 which was unprotected by the silicon oxide cap 18 was etched away by an anisotropic plasma etching process with an etchant gas mixture composed of $C_2F_6$ gas and helium (He) gas which gas mixture removes the exposed portion of blanket polysilicon layer 16 but does not attack the exposed silicon oxide cap 18 forming the floating gate electrode 16F from the blanket polysilicon layer 16.

Figure 1D:
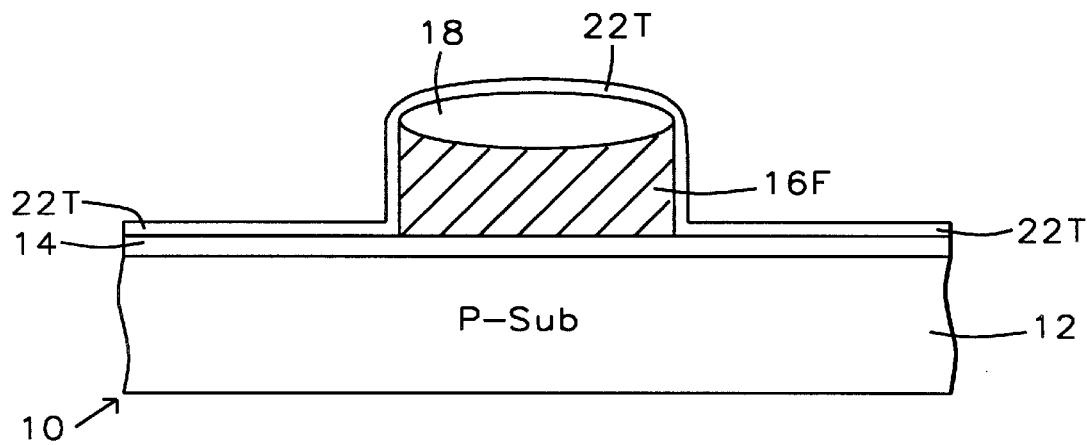

Referring to FIG. 1D the EPROM device 10 of FIG. 1C is shown after deposition of a blanket tunnel oxide layer 22T covering device 10. Tunnel oxide layer 22T comprises a thin silicon oxide layer as will be well understood by those skilled in the art.

Figure 1E:
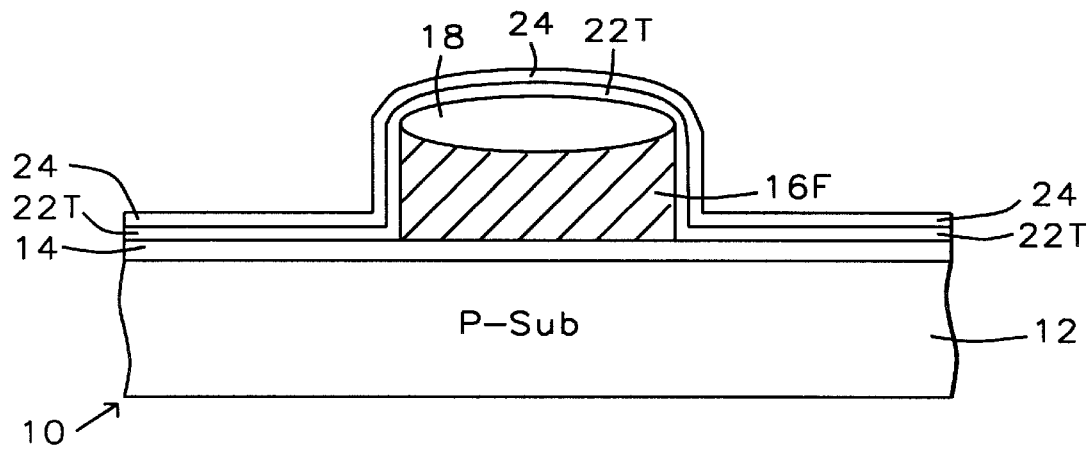

Referring to FIG. 1E the EPROM device 10 of FIG. 1D is shown after deposition of a blanket silicon nitride ($Si_3N_4$) spacer layer 24 covering blanket tunnel oxide (silicon oxide) layer 22T with a thickness of about 180 Å.

Figure 1F:
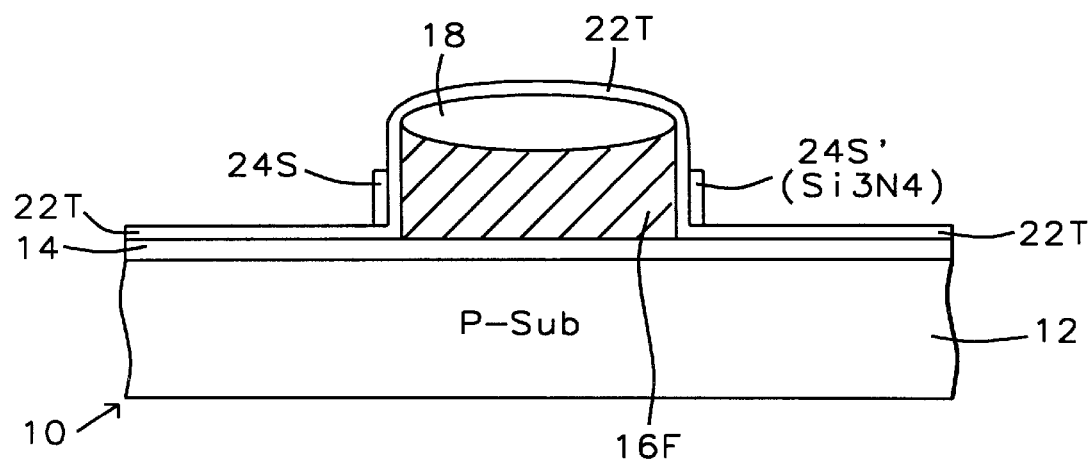

Referring to FIG. 1F the EPROM device 10 of FIG. 1E is shown after the silicon nitride spacer layer 24 has been etched by a plasma etching step with an etchant composed of sulfur hexafluoride ($SF_6$) and oxygen gas ($O_2$) to produce silicon nitride spacers 24S, 24S' adjacent to the sidewalls of floating gate electrode 16F. The spacers 24S, 24S' have a remaining thickness of about 300 Å vertically (y axis), which are substantially shorter than the sidewalls of floating gate electrode 16F, and a thickness of about 50 Å horizontally (x axis) from the sidewall of the floating gate electrode 16F. The silicon nitride spacers 24S, 24S' adjacent to the sidewalls of floating gate electrode 16F are used to protect against the reverse tunneling from the control gate electrode 28 in FIG. 1G to the floating gate electrode 16F.

Figure 1G:
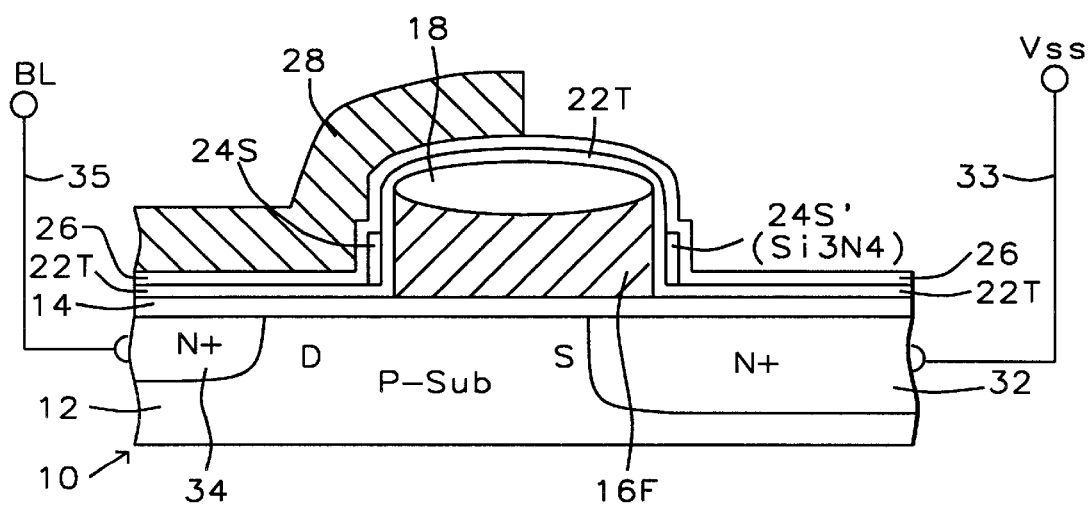

Referring to FIG. 1G the EPROM device 10 of FIG. 1F is shown after an N+ doped source region 32 and an N+ doped drain region 34 have been formed in the substrate 12 by ion implantation in accordance with a conventional process of angular ion implantation so that the source region 32 underlies the floating gate 16F.

After source region 32 and drain region 34 were formed a blanket second gate oxide layer 26 and a blanket control gate electrode layer were deposited on the device 10. Next followed etching of control gate electrode layer to form the control gate electrode 28.

The blanket second gate oxide layer 26 was deposited to cover the exposed surfaces of the tunnel oxide layer 22T and silicon nitride spacers 24S, 24S' as well as exposed portions of the upper sidewalls of floating gate electrode 16F, and silicon oxide cap 18. The doped polysilicon control gate electrode 28 has been patterned to lie over the left side of the device 10 overlying the left edge of the silicon oxide cap 18.

In addition note that the source region 32 is connected to the voltage source $V_{ss}$ as indicated by the schematic line 33 and the drain region 34 is connected to the bit line BL by schematic line 35.

One problem with the process of FIGS. 1A–1G is that it is very difficult to maintain the process because the process has an etching window which is very small on the order of a 3" process. It is difficult to maintain an etch recipe with a low etch rate and good uniformity. In addition, the problem of thinning the silicon nitride spacer layer 22 with a thickness of about 180 Å led to the design described below with reference to FIGS. 2A–2I.

Figure 2A:
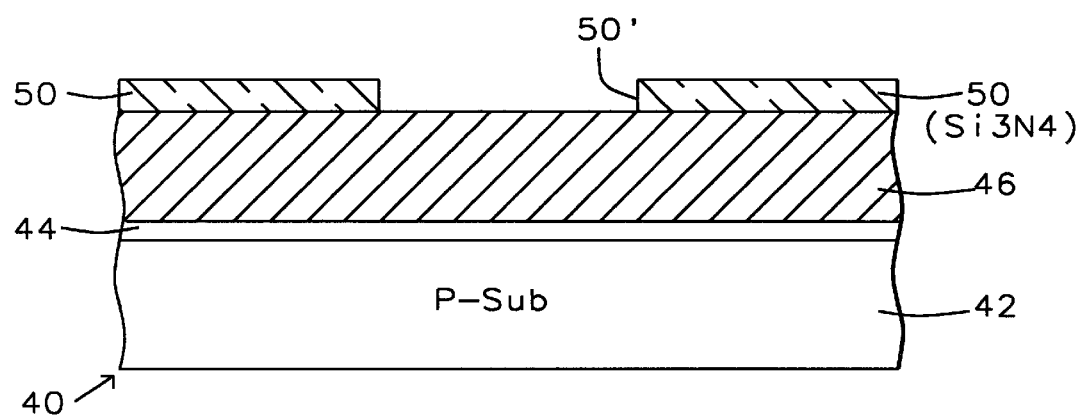
FIGS. 2A–2I illustrate the process steps of a method for producing an EPROM device with a HTO thermal oxide cap and above the floating gate of the EPROM device in accordance with the method of this invention.

Referring to FIG. 2A, an EPROM device 40 is shown in a early stage of a manufacturing process in accordance with this invention. A P-doped, silicon, semiconductor substrate 42 has a gate oxide layer 44 formed on the surface thereof. A doped polysilicon conductor layer 46 has been deposited above gate oxide layer 44. Then a silicon nitride ($Si_3N_4$) mask 50 with opening 50' has been formed over the doped polysilicon conductor layer 46.

Figure 2B:
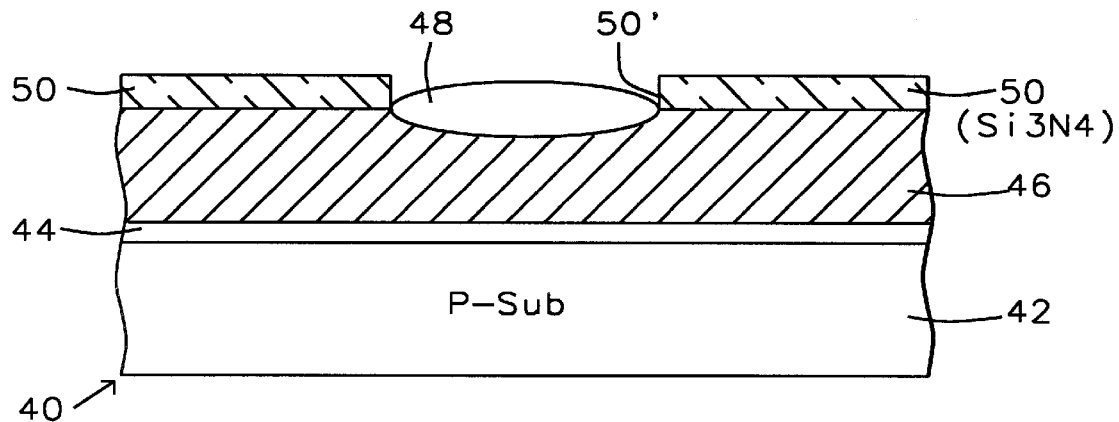

Referring to FIG. 2B the EPROM device 40 of FIG. 2A is shown after a thermal oxidation process has been employed to form a polyoxide (poly-silicon oxide) cap 48 with a thickness of about 1,500 Å through the opening 50' in the $Si_3N_4$ mask 50 in a conventional HTO (High Temperature Oxidation) process by Chemical Vapor Deposition (CVD).

Figure 2C:
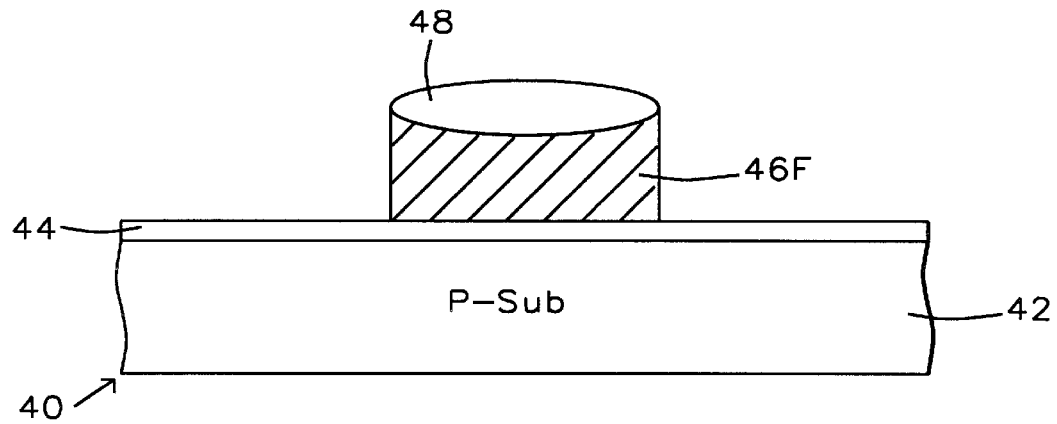

Referring to FIG. 2C the EPROM device 40 of FIG. 2B is shown after the silicon nitride ($Si_3N_4$) mask 50 has been stripped away with the portion of the doped polysilicon conductor layer 46 which was unprotected by the silicon oxide cap 48. Layer 46 was etched using an anisotropic plasma etching process with an etchant gas mixture composed of $C_2F_6$ gas and helium (He) gas which gas mixture removes the exposed portion of blanket polysilicon layer 46 but does not attack the exposed silicon oxide cap 48 forming the floating gate electrode 46F from the blanket polysilicon layer 46.

Figure 2D:
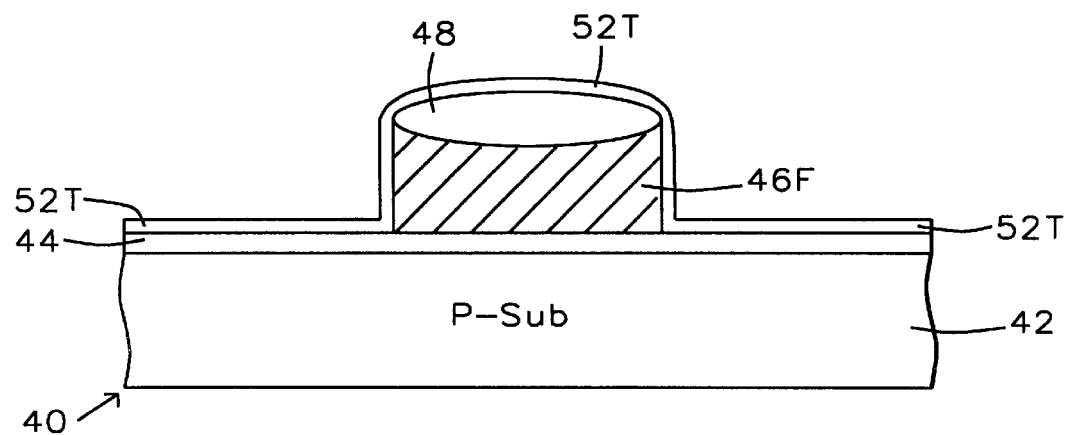

Referring to FIG. 2D the EPROM device 40 of FIG. 2C is shown after deposition of a blanket tunnel oxide layer 52T covering device 40. Tunnel oxide layer 52T comprises a thin silicon oxide layer as will be well understood by those skilled in the art.

Figure 2E:
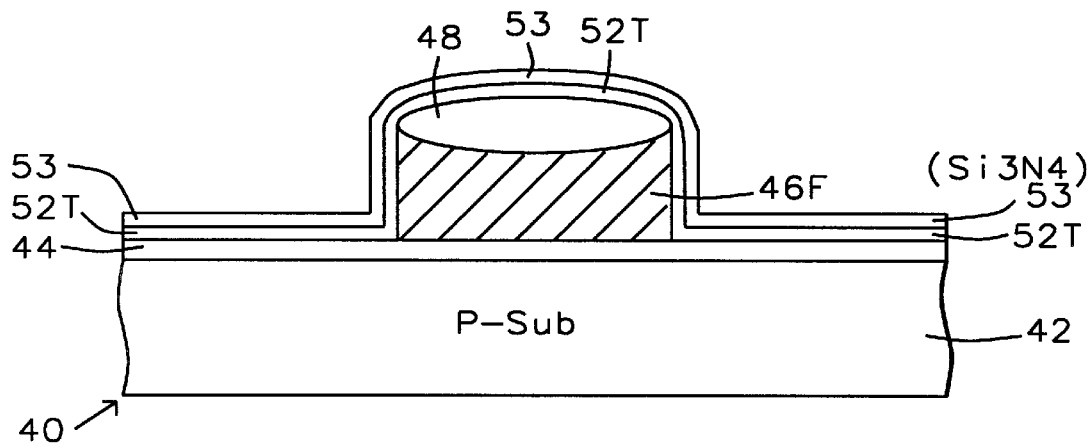

Referring to FIG. 2E the EPROM device 40 of FIG. 2D is shown after deposition of a blanket silicon nitride ($Si_3N_4$) spacer layer 53 has a thickness within a range from about 140 Å to about 180 Å, preferably with a thickness of about 180 Å. The silicon nitride ($Si_3N_4$) spacer layer 53 has sidewalls adjacent to the sidewalls of the floating gate electrode 46F conforming to the pattern thereof.

Figure 2F:
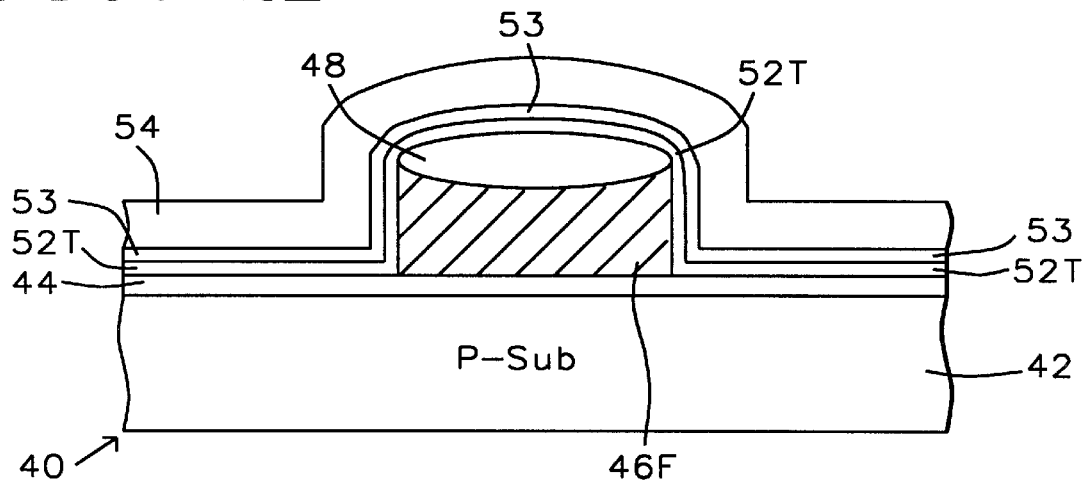

Referring to FIG. 2F the EPROM device 40 of FIG. 2E is shown after formation of a blanket silicon oxide film 54 by a deposition process such as low temperature PECVD (Plasma Enhanced Chemical Vapor Deposition) using a TEOS (TetraEthylOrthoSilicate) source. The blanket silicon oxide film 54 has a thickness from about 700 Å to about 1,200 Å, (preferably a thickness of about 1000 Å) over the silicon nitride ($Si_3N_4$) spacer layer 53.

Figure 2G:
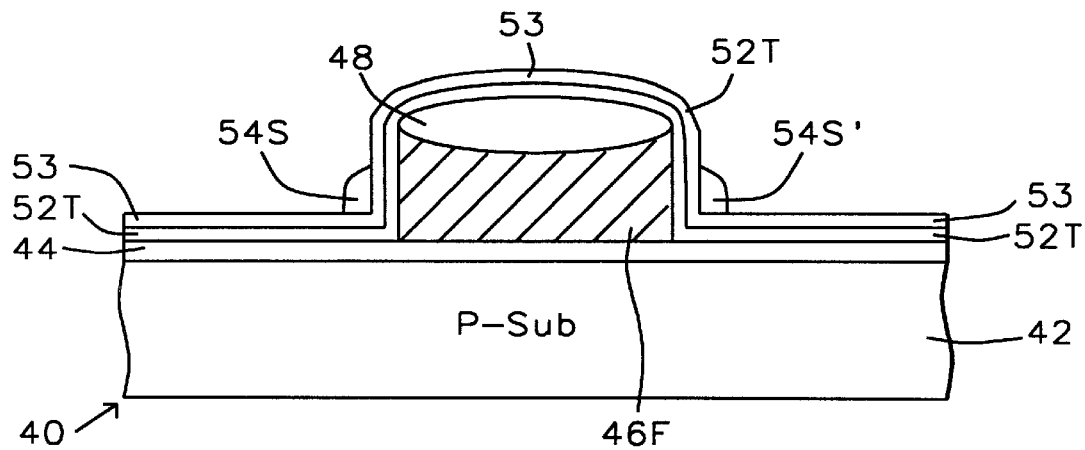

Referring to FIG. 2G the EPROM device 40 of FIG. 2F is shown after anisotropic dry etching of the silicon oxide film 54 leaving silicon oxide sidewall spacers 54S, 54S', which are substantially shorter than the sidewalls of floating gate electrode 46F, adjacent to the sidewalls of the silicon nitride layer 53. The dry etching is performed by plasma etching of the silicon oxide film 54 in an atmosphere comprising a mixture of etchant gases composed of $C_2F_6$ gas and helium (He) gas which gas mixture etches back the exposed portion of blanket silicon oxide layer 54 with a high degree of selectivity between the silicon oxide layer 54 and the silicon nitride layer 53 below.

Figure 2H:
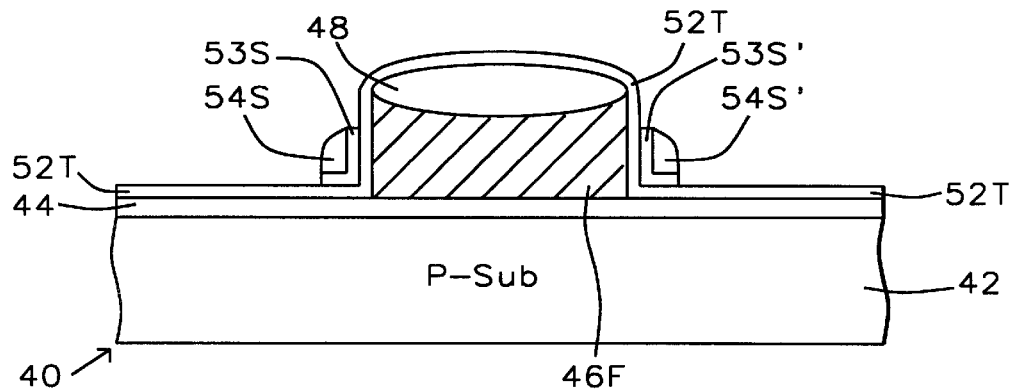

Referring to FIG. 2H the EPROM device 40 of FIG. 2G is shown after a wet oxide etch with an etchant (such as a hydrofluoric acid solution of 50 $H_2O$:1 HF) to remove an additional portion of the material of the silicon oxide spacers 54S to adjust the radius thereof to a radius from about 200 Å to about 400 Å to provide reduced size silicon oxide spacers 54S' covering the silicon nitride ($Si_3N_4$) layer 53 to provide protection thereof and to provide the precisely planned size of silicon nitride ($Si_3N_4$) spacers 53S, 53S' to be formed in the next step.

Then in the next step, the exposed surfaces of silicon nitride ($Si_3N_4$) spacer layer 53 are etched in wet hot $H_3PO_4$ (phosphoric acid) to remove the portions thereof unprotected by the silicon oxide spacers 54S' producing silicon nitride spacers 53S, 53S'. Note that the silicon oxide spacers 54S, 54S' fill in the space defined by the "L" shaped silicon nitride spacers 53S, 53S'. The precisely planned L-shaped silicon nitride spacers 53S, 53S' adjacent to the floating gate electrode 46F protect against the reverse tunneling from the floating gate electrode 46F to the control gate electrode 58, as seen in FIG. 2I.

The silicon nitride spacers 53S, 53S' have a thickness as stated above from about 140 Å to about 180 Å have a height of the upright portion of the "L" of about 300 Å vertically (y axis) and a width of the horizontal portion of the "L" of about 200 Å horizontally (x axis) from the sidewall of the floating gate electrode 46F. The silicon oxide spacers 54S, 54S' have dimensions of from about 150 Å to about 300 Å.

The height and width of the $Si_3N_4$ spacers 53S, 53S' can be controlled easily using the process of this invention because the wet etching rate of silicon nitride layer 53 is very low, (about 60 Å/minute) so it is very easy to control the process time (process window<5').

Figure 2I:
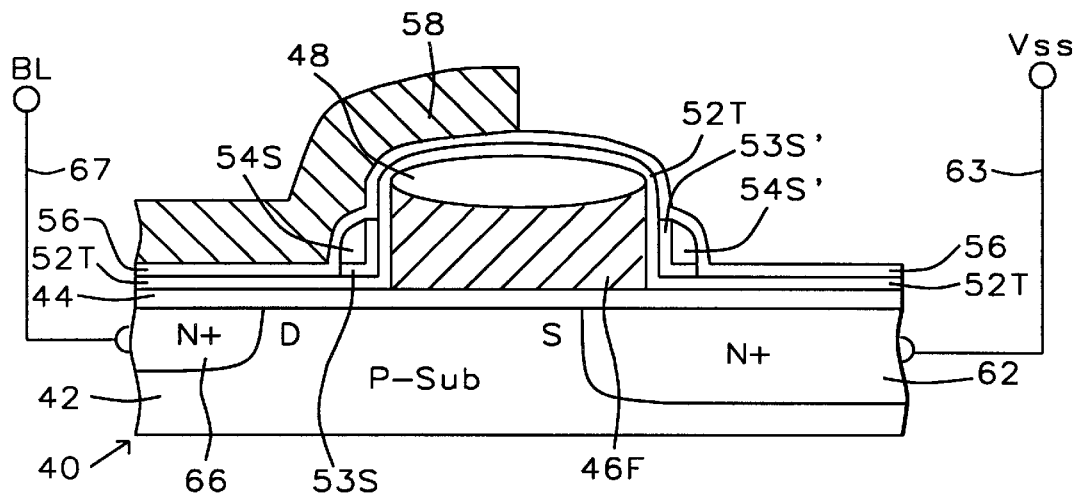

Referring to FIG. 2I the EPROM device 40 of FIG. 2H is shown after an N+ doped source region 62 and an N+ doped drain region 66 have been formed in the substrate 42 by ion implantation in accordance with a conventional process of angular ion implantation so that the source region 62 partially underlies the floating gate 46F.

After source region 62 and drain region 66 were formed a blanket second gate oxide layer 56 and a blanket control gate electrode layer 58 composed of doped polysilicon were deposited on the device 40. Next followed etching of control gate electrode layer to form the control gate electrode 58. The doped polysilicon control gate electrode 58 has been patterned to lie over the left side of the device 40 overlying the left edge of the silicon oxide cap 48.

Note that the blanket second gate oxide layer 56 was deposited over device 40 covering the exposed surfaces of the tunnel oxide layer 52T, silicon nitride spacers 53S, 53S', silicon oxide spacers 54S, 54S' as well as exposed portions of the upper sidewalls of floating gate electrode 46F. Note that polysilicon oxide cap 48 is already covered by tunnel oxide layer 52T.

In addition note that the source region 32 is connected to the voltage source $V_{ss}$ as indicated by the schematic line 63 and the drain region 66 is connected to the bit line BL by schematic line 67.

Also, a doped polysilicon control gate electrode 58 has been formed over the left size of the device overlying the left edge of the silicon oxide cap 48. Second gate oxide layer 56 preferably has a thickness from about 100 Å to about 150 Å.

Table I below lists experimental data which was recorded using the process of FIGS. 2A–2H. Table II below lists the data for the process of FIGS. 1A–1E.

TABLE I

W. A. T. DATA SHEET
PRODUCT: TM418   PROCESS: 05TW17S1
LOT ID: A52531.5   DATE: 03/27/1997

| WAF ID | SITE ID | BVOX_NHAC V I = −100nA | FTV/.6 V | RTV/.6 V |
| --- | --- | --- | --- | --- |
| 1 | −1 | −23.00 | 7.500 | −19.30 |
| 1 | −2 | −21.80 | 7.670 | −20.50 |
| 1 | −3 | −23.80 | 7.930 | −20.60 |
| 1 | −4 | −23.50 | 7.620 | −20.30 |
| 1 | −5 | −21.50 | 7.720 | −20.30 |
| 2 | −1 | −24.20 | 0.0000E+00 | −18.00 |
| 2 | −2 | −23.70 | 7.790 | −20.40 |
| 2 | −3 | −23.90 | 7.790 | −20.30 |
| 2 | −4 | −24.20 | 0.0000E+00 | −20.30 |
| 2 | −5 | −24.00 | 7.740 | −20.20 |

FTV = Forward Tunneling Voltage
RTV = Reverse Tunneling Voltage
BVOX_NHAC = Breakdown Voltage Oxide_N(N-type) High voltage ACtive device.
WAF ID = Wafer Identification
Site ID = Site Identification
Specifications
about FTV < RTV
about 7V < −18.0V
BVOX_NHAC about −23.00V

TABLE II

W.A.T. DATA SHEET
PRODUCT: TM418   PROCESS: 05TW17S1
LOT ID: A52531.5   DATE: 03/27/1997

| WAF ID | SITE ID | BVOX_NHAC V I = −100 nA | FTV/.6 V | RTV/.6 V | |
| --- | --- | --- | --- | --- | --- |
| 6 | −1 | −19.80 | 7.390 | −17.00 | M/E 20" HTO = 100Å |
| 6 | −2 | −19.00 | 7.680 | −17.60 | |
| 6 | −3 | −19.80 | 7.890 | −17.10 | O/E 33" |
| 6 | −4 | −20.00 | 7.530 | −17.30 | |
| 6 | −5 | −19.90 | 7.590 | −17.50 | |
| 7 | −1 | −20.30 | 7.500 | −19.90 | |
| 7 | −2 | −19.90 | 7.660 | −20.20 | O/E 30" |
| 7 | −3 | −19.30 | 7.930 | −20.10 | |

TABLE II-continued

W.A.T. DATA SHEET

PRODUCT: TM418  PROCESS: 05TW17S1
LOT ID: A52531.5  DATE: 03/27/1997

| WAF ID | SITE ID | BVOX_NHAC V I = −100 nA | FTV/.6 V | RTV/.6 V | |
|---|---|---|---|---|---|
| 7 | −4 | −19.50 | 7.650 | −20.40 | |
| 7 | −5 | −20.30 | 7.680 | −19.80 | |
| 8 | −1 | −20.70 | 7.630 | −20.60 | |
| 8 | −2 | −20.50 | 7.850 | −20.70 | O/E 25" |
| 8 | −3 | −21.10 | 8.060 | −20.60 | |
| 8 | −4 | −20.80 | 0.0000E+00 | −20.50 | |
| 8 | −5 | −20.70 | 7.750 | −20.60 | |
| 9 | −1 | −21.00 | 9.250 | −21.10 | |
| 9 | −2 | −19.80 | 9.640 | −21.20 | O/E 15" |
| 9 | −3 | −20.10 | 9.730 | −21.20 | |
| 9 | −4 | −20.90 | 0.0000E+00 | −21.10 | |
| 9 | −5 | −20.10 | 9.550 | −21.20 | |
| 10 | −1 | −20.60 | 10.20 | −21.20 | |
| 10 | −2 | 20.20 | 10.50 | −21.20 | O/E 10" |
| 10 | −3 | −21.30 | 10.80 | −21.20 | |
| 10 | −4 | −20.20 | 10.20 | −21.20 | |
| 10 | −5 | −21.20 | 10.60 | −21.20 | |
| 11 | −1 | −22.60 | 11.00 | −21.20 | |
| 11 | −2 | −22.20 | 11.00 | −21.30 | |
| 11 | −3 | −23.30 | 11.00 | −21.30 | O/E 5" |
| 11 | −4 | −22.20 | 0.0000E+00 | −21.20 | |
| 11 | −5 | −22.20 | 11.00 | −21.30 | |
| 12 | −1 | −23.20 | 11.00 | −21.30 | |
| 12 | −2 | −24.90 | 11.00 | −21.30 | |
| 12 | −3 | −23.00 | 11.00 | −21.30 | O/E 0" |
| 12 | −4 | −22.80 | 0.4000E-03 | −21.20 | |
| 12 | −5 | −24.70 | 11.00 | −21.30 | |
| 13 | −1 | −29.60 | 0.0000E+00 | −21.30 | |
| 13 | −2 | −29.80 | 11.00 | −21.30 | M/E 20" HTO = 200Å |
| 13 | −3 | 29.40 | 11.00 | −21.30 | M/E 20" HTO = 200Å |
| 13 | −4 | −28.50 | 2.750 | −21.30 | O/E 0" |
| 13 | −5 | −29.40 | 0.0000E+00 | −21.30 | |
| 14 | −1 | −23.10 | 11.00 | −21.30 | |
| 14 | −2 | −25.70 | 11.00 | −21.30 | O/E 5" |
| 14 | −3 | −24.50 | 11.00 | −21.40 | |
| 14 | −4 | −24.20 | 11.00 | −21.30 | |
| 14 | −5 | −23.50 | 11.00 | −21.40 | |
| 15 | −1 | −25.50 | 0.0000E+00 | 0.0000E+00 | |
| 15 | −2 | −25.80 | 0.0000E+00 | −21.20 | O/E 10" |
| 15 | −3 | −26.10 | 0.0000E+00 | −21.20 | |
| 15 | −4 | −25.90 | 0.0000E+00 | 0.0000E+00 | |
| 15 | −5 | −25.80 | 0.0000E+00 | 0.0000E+00 | |
| 16 | −1 | −23.30 | 8.770 | −21.00 | |
| 16 | −2 | −21.90 | 8.810 | −21.00 | O/E 20" |
| 16 | −3 | −22.50 | 8.990 | −21.00 | |
| 16 | −4 | −23.00 | 8.950 | −21.10 | |
| 16 | −5 | −22.30 | 8.950 | −21.10 | |
| 17 | −1 | −23.80 | 8.360 | −18.00 | |
| 17 | −2 | −23.80 | 8.520 | −18.00 | O/E 30" |
| 17 | −3 | −24.00 | 8.750 | −18.40 | |
| 17 | −4 | −23.40 | 0.0000E+00 | −17.50 | |
| 17 | −5 | −24.10 | 0.0000E+00 | −17.70 | |
| 18 | −1 | −22.20 | 8.220 | −15.00 | |
| 18 | −2 | −20.80 | 8.340 | −15.30 | O/E 35" |
| 18 | −3 | −21.50 | 8.570 | −14.90 | |
| 18 | −4 | −22.60 | 0.0000E+00 | −15.50 | |
| 18 | −5 | −21.10 | 0.0000E+00 | −15.10 | |
| 19 | −1 | −30.00 | 11.00 | −21.30 | M/E 40" HTO = 200Å |
| 19 | −2 | 0.000CE+00 | 11.00 | −21.30 | |
| 19 | −3 | −29.90 | 11.00 | −21.30 | O/E 0" |
| 19 | −4 | −29.10 | 0.0000E+00 | −21.30 | |
| 19 | −5 | −29.90 | 11.00 | −21.30 | |
| 20 | −1 | −22.70 | 9.240 | −21.30 | |
| 20 | −2 | −23.70 | 9.690 | −21.30 | O/E 5" |
| 20 | −3 | −22.70 | 9.900 | −21.30 | |
| 20 | −4 | −23.50 | 9.670 | −21.30 | |
| 20 | −5 | −22.20 | 0.0000E+00 | −21.30 | |
| 21 | −1 | −24.20 | 0.0000E+00 | −21.20 | O/E 10" |
| 21 | −2 | −24.40 | 9.440 | −21.30 | |
| 21 | −3 | −25.30 | 9.350 | −21.30 | |
| 21 | −4 | −24.20 | 0.0000E+00 | −21.20 | |
| 21 | −5 | −24.60 | 0.0000E−00 | −21.20 | |

TABLE II-continued

W.A.T. DATA SHEET
PRODUCT: TM418  PROCESS: 05TW17S1
LOT ID: A52531.5  DATE: 03/27/1997

| WAF ID | SITE ID | BVOX_NHAC V I = −100 nA | FTV/.6 V | RTV/.6 V | |
|---|---|---|---|---|---|
| 22 | −1 | −21.90 | 8.440 | −21.10 | O/E 20" |
| 22 | −2 | −20.80 | 8.650 | −21.20 | |
| 22 | −3 | −21.06 | 8.980 | −21.30 | |
| 22 | −4 | −21.50 | 0.0000E+00 | −21.20 | |
| 22 | −5 | −22.20 | 0.0000E+00 | −21.10 | |
| 23 | −1 | −22.50 | 8.280 | −17.80 | O/E 30" |
| 23 | −2 | −22.50 | 8.560 | −17.80 | |
| 23 | −3 | −23.00 | 8.710 | −17.20 | |
| 23 | −4 | −22.30 | 0.0000E+00 | −17.50 | |
| 23 | −5 | −22.70 | 0.0000E+00 | −17.60 | |
| 24 | −1 | −21.20 | 8.120 | −15.10 | O/E 35" |
| 24 | −2 | −20.00 | 8.300 | −15.60 | |
| 24 | −3 | −21.30 | 8.480 | −15.20 | |
| 24 | −4 | 20.80 | 8.270 | −15.50 | |
| 24 | −5 | −20.50 | 0.0000E+00 | −15.10 | |

SUMMARY

1. The stability of the process of FIGS. 2A–2H is better than the process of FIGS. 1A–1E because the etching process window (etching time) is longer than the original process.
2. The method of FIGS. 2A–2I controls the height and width of the "L" shape $Si_3N_4$ spacer.
3. With the method of FIGS. 2A–2I loss of HTO oxide is easily controlled, i.e. HTO oxide loss is less than about 20 Å.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor memory device formed on a semiconductor substrate comprising:
   a silicon oxide, dielectric layer formed on the surface of said substrate,
   a floating gate electrode with a top surface and having sidewalls, said floating gate electrode being formed on the surface of said silicon oxide dielectric layer,
   a cap layer composed of a dielectric material formed over the top surface of said floating gate electrode,
   a thin, dielectric layer covering said cap layer, said sidewalls of said floating gate electrode and exposed surfaces of said silicon oxide, dielectric layer,
   a spacer structure formed adjacent to the sidewalls of said floating gate electrode formed on said thin, dielectric layer, said spacer structure including inner dielectric, sidewall spacers over said thin, dielectric layer comprising conforming L-shaped sidewall spacers adjacent to said floating gate sidewalls, and outer dielectric, spacers over said inner dielectric, sidewall spacers,
   an interelectrode dielectric layer formed over said spacer structure and over exposed surfaces of said thin dielectric layer,
   a control gate electrode over said interelectrode dielectric layer patterned with said floating gate electrode to form a gate electrode stack overlying only one edge of said floating gate electrode, and
   said substrate including source/drain regions in said substrate cooperating with said gate electrode stack to form a memory cell.

2. A device in accordance with claim 1 wherein said cap layer has a thickness of about 100 Å.

3. A device in accordance with claim 1 wherein:
   said inner dielectric, spacers have a thickness of about 180 Å.

4. A device in accordance with claim 1 wherein:
   said cap layer has a thickness of about 100 Å, and
   said inner dielectric, spacers have a thickness of about 180 Å.

5. A device in accordance with claim 1 wherein:
   said cap layer has a thickness of about 100 Å,
   said inner dielectric, spacers comprises a silicon nitride layer having a thickness of about 180 Å, and
   said outer dielectric, spacers comprises a thick silicon oxide layer.

6. An EPROM semiconductor memory device formed on a semiconductor substrate comprising:
   a first gate oxide layer formed on the surface of said substrate,
   a floating gate electrode with a top surface and sidewalls formed on the surface of said gate oxide layer, said floating gate electrode being composed of doped polysilicon,
   a cap layer composed of an oxide of said floating gate electrode over the top surface of said floating gate electrode,
   a thin tunnel oxide layer covering said cap layer, said floating gate electrode and said gate oxide layer,
   a spacer structure adjacent to the sidewall of said floating gate electrode formed on said tunnel oxide layer above said gate oxide layer, said spacer structure comprising an inner dielectric, spacer layer and an outer dielectric, spacer layer formed over said device,
   said inner dielectric, spacer layer being formed as conforming L-shaped sidewalls adjacent to said sidewalls of said floating gate electrode, said outer dielectric, spacer layer being formed over said inner dielectric, spacer layer, said outer dielectric, spacer layer forming a spacer on said conforming L-shaped sidewalls of said inner dielectric, spacer layer, an interelectrode dielectric layer over said cap layer, said spacer structure and said substrate, a control gate electrode over said interelectrode dielectric layer patterned with said floating gate electrode to form a gate electrode stack, said substrate including source/drain regions in said substrate cooperating with said gate electrode stack to form a memory cell.

7. A device in accordance with claim 6 wherein said cap layer has a thickness of about 100 Å.

8. A device in accordance with claim 6 wherein said inner dielectric, spacer layer has a thickness of about 180 Å.

9. A device in accordance with claim 6 wherein:

said cap layer has a thickness of about 100 Å, and said inner dielectric, spacer layer has a thickness of about 180 Å.

10. A device in accordance with claim 6 wherein:

said cap layer has a thickness of about 100 Å, said inner dielectric, spacer layer comprises a silicon nitride layer having a thickness of about 180 Å, and said outer dielectric, spacer layer comprises a thick silicon oxide layer.

11. An EPROM semiconductor memory device formed on a semiconductor substrate comprising:

a gate oxide layer formed on the surface of said substrate, a floating gate electrode with a top surface and sidewalls formed on the surface of said gate oxide layer, a cap layer composed of a dielectric material formed over the top surface of said floating gate electrode, a thin dielectric layer formed covering said cap layer, said sidewalls of said floating gate electrode and said first gate oxide layer, a spacer structure formed on said thin dielectric layer adjacent to said sidewalls of said floating gate electrode, an interelectrode dielectric layer formed over said spacer structure and over exposed portions of said thin dielectric layer, a control gate electrode formed over said interelectrode dielectric layer patterned with said floating gate electrode to form a gate electrode stack, and said substrate including source/drain regions in said substrate cooperating with said gate electrode stack to form a memory cell.

12. A device in accordance with claim 11 wherein:

said spacer structure includes inner dielectric, sidewall spacers and an outer dielectric, spacers, said inner dielectric, sidewall spacers being L-shaped and being formed over said thin dielectric layer adjacent to said sidewalls, and said outer dielectric spacers being formed over said inner dielectric sidewall spacers.

13. A device in accordance with claim 12 wherein:

said inner dielectric, spacers have a thickness of about 180 Å.

14. A device in accordance with claim 12 wherein:

said cap layer has a thickness of about 100 Å, and said inner dielectric, spacers have a thickness of about 180 Å.

15. A device in accordance with claim 12 wherein:

said cap layer has a thickness of about 100 Å, said inner dielectric, spacers comprise a silicon nitride layer having a thickness of about 180 Å, and said outer dielectric, spacers comprises a thick silicon oxide layer.

16. A device in accordance with claim 11 wherein:

said spacer structure is formed on said thin dielectric layer.

17. A device in accordance with claim 11 wherein:

said spacer structure comprises a silicon nitride layer which is formed on said thin dielectric layer.

* * * * *